United States Patent
Portela (10) Patent No.: US 9,824,600 B1
(45) Date of Patent: Nov. 21, 2017

(54) ELECTROMAGNETIC BAND AND PHOTOELECTRIC CELL SAFETY DEVICE

(71) Applicant: Mario Placido Portela, Miami, FL (US)

(72) Inventor: Mario Placido Portela, Miami, FL (US)

( * ) Notice: Subject to any disclaimer, the term of this patent is extended or adjusted under 35 U.S.C. 154(b) by 0 days.

(21) Appl. No.: 13/911,220

(22) Filed: Jun. 6, 2013

Related U.S. Application Data (63) Continuation-in-part of application No. 12/954,888, filed on Nov. 28, 2010, now abandoned.

(51) Int. Cl.
 *B60N 99/00* (2006.01)
 *G08G 9/02* (2006.01)

(52) U.S. Cl.
 CPC .................... *G08G 9/02* (2013.01)

(58) Field of Classification Search
 CPC ....... G07C 5/0825; B60R 19/00; B60R 13/00; B63B 1/00; B63B 43/00; B61D 15/00
 USPC ............ 701/1, 23, 31.4, 45, 117, 119, 301; 340/435, 438, 468
 See application file for complete search history.

(56) References Cited

U.S. PATENT DOCUMENTS

| | | | |
|---|---|---|---|
| 2,216,575 A | 10/1940 | Seinfield | |
| 2,317,652 A | 4/1943 | Toney | |
| 2,412,822 A | 12/1946 | Malter | |
| 2,699,834 A | 1/1955 | O'Brien | |
| 2,551,120 A | 9/1958 | Fogiel | |
| 3,514,610 A * | 5/1970 | Huston et al. | 250/206 |
| 3,533,061 A | 10/1970 | Treiterer | |
| 3,802,727 A | 4/1974 | Beckley | |
| 3,892,483 A | 7/1975 | Saufferer | |
| 4,407,388 A | 10/1983 | Steel | |
| 4,641,136 A | 2/1987 | Kowalczyk | |
| 5,495,243 A * | 2/1996 | McKenna | 340/902 |
| 6,085,151 A | 7/2000 | Farmer et al. | |
| 6,246,933 B1 | 6/2001 | Bague' | |
| 6,268,803 B1 | 7/2001 | Gunderson et al. | |
| 6,405,132 B1 * | 6/2002 | Breed et al. | 701/301 |
| 6,411,205 B1 * | 6/2002 | Reid | 340/468 |
| 6,819,991 B2 * | 11/2004 | Rao et al. | 701/45 |
| 6,831,572 B2 * | 12/2004 | Strumolo et al. | 340/903 |
| 6,834,899 B2 | 12/2004 | Lindsey | |
| 7,026,954 B2 * | 4/2006 | Slemmer et al. | 340/932.2 |
| 7,240,622 B2 * | 7/2007 | Koide | 104/287 |
| 7,366,595 B1 | 4/2008 | Shimizu et al. | |
| 7,418,346 B2 * | 8/2008 | Breed et al. | 701/301 |
| 7,772,968 B2 * | 8/2010 | Lin | 340/435 |
| 8,403,402 B1 * | 3/2013 | Portela | 296/187.03 |

(Continued)

FOREIGN PATENT DOCUMENTS

JP 08318799 A * 12/1996 ............. B60R 19/14

*Primary Examiner* — Truc M Do
(74) *Attorney, Agent, or Firm* — Malloy & Malloy, P.L.

(57) ABSTRACT

The device object of the present invention consists in two sets of photoelectric cells installed at front and rear of trucks and automobiles and in general moving vehicles. The photoelectric cells are attached to a Magnetic breaking system. In a separate preferred embodiment of the present invention the Photoelectric cells further controls the regular breaking system of the vehicle. It is emphasized that this abstract is provided to comply with the rules requiring an abstract that will allow a searcher or other reader to quickly ascertain the subject matter of the technical disclosure.

14 Claims, 9 Drawing Sheets

(56) References Cited

U.S. PATENT DOCUMENTS

| | | | |
|---|---|---|---|
| 2001/0029408 A1 | 10/2001 | Murray et al. | |
| 2002/0060640 A1* | 5/2002 | Davis et al. | 342/104 |
| 2002/0198632 A1* | 12/2002 | Breed et al. | 701/1 |
| 2004/0142603 A1 | 7/2004 | Walker | |
| 2005/0171681 A1* | 8/2005 | Yang et al. | 701/116 |
| 2006/0017656 A1 | 1/2006 | Miyahara | |
| 2006/0186702 A1 | 8/2006 | Kisanuki et al. | |
| 2006/0287821 A1 | 12/2006 | Lin | |
| 2007/0005609 A1* | 1/2007 | Breed | 707/10 |
| 2007/0201795 A1* | 8/2007 | Rice et al. | 385/39 |
| 2008/0231435 A1* | 9/2008 | Lin | 340/435 |
| 2009/0027149 A1* | 1/2009 | Kocijan | B25B 11/002 335/288 |
| 2009/0033540 A1* | 2/2009 | Breed et al. | 342/29 |
| 2010/0108416 A1 | 5/2010 | Lind | |
| 2010/0310794 A1* | 12/2010 | Nordvik | B60R 13/005 428/31 |
| 2012/0206278 A1* | 8/2012 | Lamping | B60C 23/0413 340/945 |
| 2012/0234927 A1* | 9/2012 | Poidomani | G06K 19/0702 235/492 |
| 2013/0187771 A1* | 7/2013 | Rothschild | 340/435 |

\* cited by examiner

ELECTROMAGNETIC BAND AND PHOTOELECTRIC CELL SAFETY DEVICE

CLAIM OF PRIORITY FROM RELATED APPLICATIONS

The present application is a Continuation in Part (C.I.P.) Application of and claims priority from copending U.S. Nonprovisional patent application Ser. No. 12/954,888 by Mario Placido Portela directed to a PHOTOELECTRIC CELL SAFETY DEVICE that is hereby incorporated by reference. U.S. Nonprovisional patent application Ser. No. 12/954,888 was the daughter application of U.S. Provisional Patent Application No. 61/393,935 filed on Oct. 17, 2010 to Mario Placido Portela, directed to ELECTROMAGNETIC BAND AND PHOTOELECTRIC CELL SAFETY DEVICE that is also hereby incorporated by reference.

BACKGROUND OF THE INVENTION

Field of the Invention

The invention relates generally to automotive vehicles, including trains, boats, car, trucks, carts, and the like. More particularly it relates to automatic controls to prevent collisions between vehicles.

Brief Description of the Prior Art

Photoelectric cell safety devices are well known in the art. Various Patents and Published Patent applications are in fact directed to photoelectric cell safety devices. While developing the invention of the instant application independently the Inventor researched extensively the public record as well as the current market for Photoelectric cell safety devices s and magnetic bands: the most relevant examples found in the search are mentioned in the Information Disclosure Statement (IDS) attached.

Despite all the efforts listed above prior art patents describe structures that are either not truly convenient or else involve complicated, expensive, and overly difficult assembly and/or disassembly parts and procedures. These shortfalls make that no device currently know or previously disclosed can activate a magnetic bumping or breaking system ahead of time to prevent a collision. Other devices have been advertised on various media but never patented or described into a printed publication.

SUMMARY OF THE INVENTION

The device object of the present invention consists in two sets of photoelectric cells installed at front and rear of trucks and automobiles and in general moving vehicles. The photoelectric cells are attached to a Magnetic breaking system such as the one disclosed in U.S. Pat. No. 8,403,402 issued on Mar. 26, 2013 to Mario Placido Portela that is hereby incorporated by reference. In a separate preferred embodiment of the present invention the Photoelectric cells further controls the regular breaking system of the vehicle.

The magnetic braking system of the instant invention, as described in U.S. Pat. No. 8,403,402 issued on Mar. 26, 2013 to Mario Placido Portela, is an electromagnetic band designed to wrap around different kind of vehicles such as automobiles, carriages, cars, boats, and trains. The object of the magnetic braking system of the present invention is to envelope the outside perimeter of said vehicle to create an electromagnetic field that repels away from other automobiles using the same technology. Due to the principles of magnetism, magnets either attract or repel a certain object depending upon the similarity of the poles-like poles repel. It is well known that different poles attract each other same poles repel each other. Considering that the purpose of the magnetic braking system is to repel away from other vehicles or walls/barriers, then opposing magnets must have compatible poles; thus, creating a repelling force between the objects.

This combination of an "electric eye" with a Magnetic Band has an instantaneous reaction to any object being all of a sudden in front of it at a distance previously determined and set as we see in automatic doors of all types as well in all type of automatic machines. Thus selectively activating the magnetic braking system upon getting close to an object. In vehicles it will activate the magnetic band even before the driver reacts. The rear set of cells would be active only when the vehicle is moving backwards for the purpose of parking or leaving the parking place. This has the advantage over the prior art of activating the magnetic band, and or the brakes of the vehicle only upon some triggering event detected by the electronic eye.

It is then the principal object of the present invention to provide for a device to avoid accidents when a distracted driver crossing in front of the car with a metallic body such as a car could cause it. For example, if a driver distractedly drives into the pathway of some one backing up a car the device of the present invention detects the incoming car and activates the magnetic band and or the regular brakes. The functionality of the magnetic band in fact is restricted to situations where all vehicles have magnetic dipoles oriented on the same (N to N or S to S) way. For example the bumper of a racetrack, race-cars, ships going trough a canal; but it is not likely to work in crowded or mixed environments.

It is a secondary objective of the present invention to provide for a device that is safe to use and practical to install. It is an additional objective of the present invention to provide a device that does not rust, or deteriorates in the conditions of a moving vehicle. It is a final objective of the present invention to provide for a device that is relatively inexpensive to build, install, and maintain, but that can eventually be sold at a premium.

These and other objective achieved by the device of the present invention will be apparent by the drawings, by their detailed description, and by the specification here from appended.

BRIEF DESCRIPTION OF THE DRAWINGS

FIG. 8 shows the detail of the structure of the magnetic band, as originally claimed and disclosed in U.S. Pat. No. 8,403,402 issued on Mar. 26, 2013 to Mario Placido Portela that was incorporated by reference at the time of the filing of the present Continuation in Part (CIP) Application. of the present invention comprising an adhesive layer (20), a magnetic shield (21), a support member (22), and a magnet (23). In a separate embodiment of the present invention the fastening action of said adhesive layer is supported by fastening means (24) such as screw, nails, bolts, washers, or the like annexed to the body of the vehicle (25). Due to the electromagnetic nature of the present invention said fastening means may be made of magnetically insulating material such as plastic, polymeric resins, fiberglass, or the like. Additionally the present invention teaches that the magnetic band is activated manually. A manual activator, not shown in the drawings, is also an essential element of the invention.

DESCRIPTION OF THE PREFERRED EMBODIMENT

Figure 1:
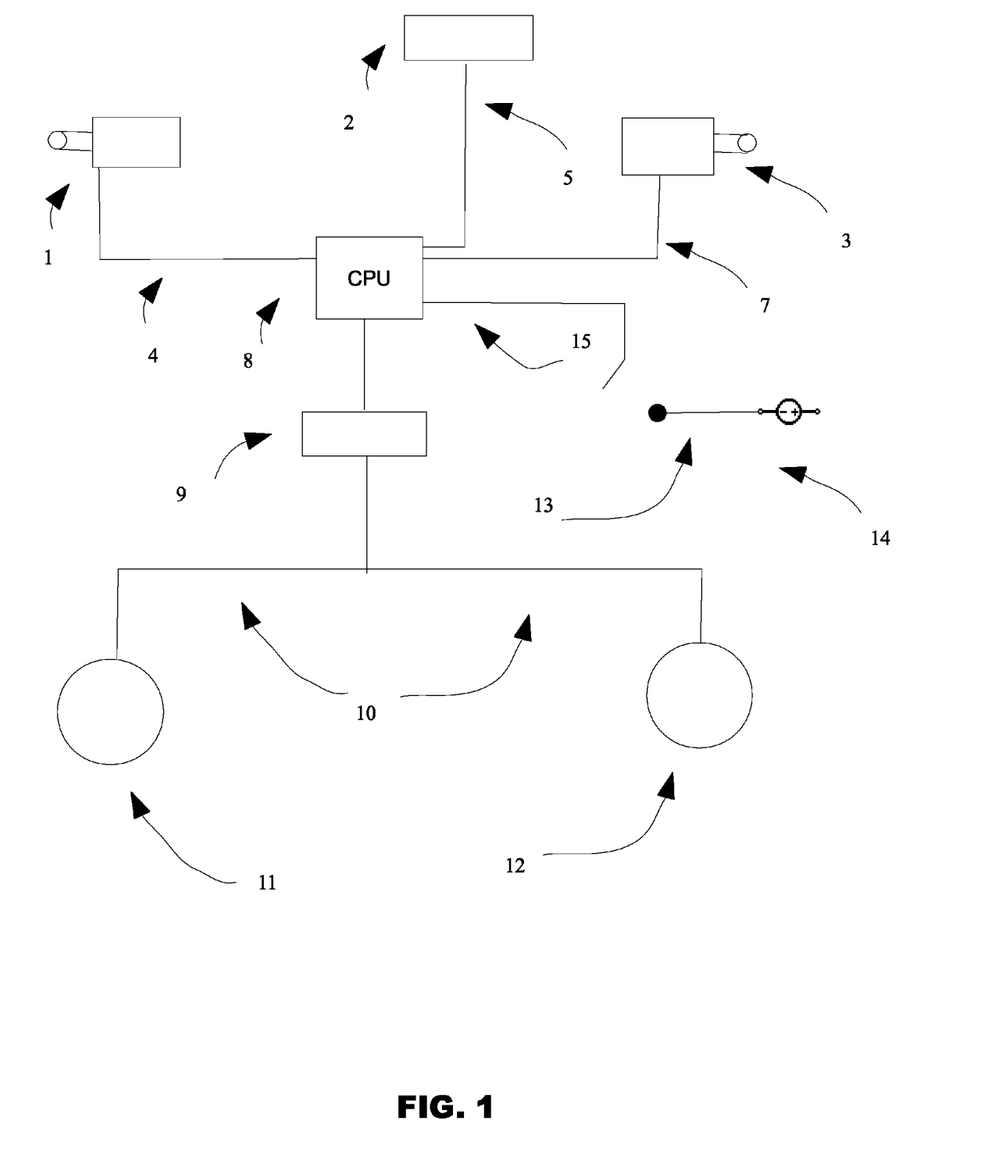
FIG. 1 is a diagram illustrating the general assembly of the ELECTROMAGNETIC BAND AND PHOTOELECTRIC CELL SAFETY DEVICE in accordance with the teachings of the present invention.
Figure 2:
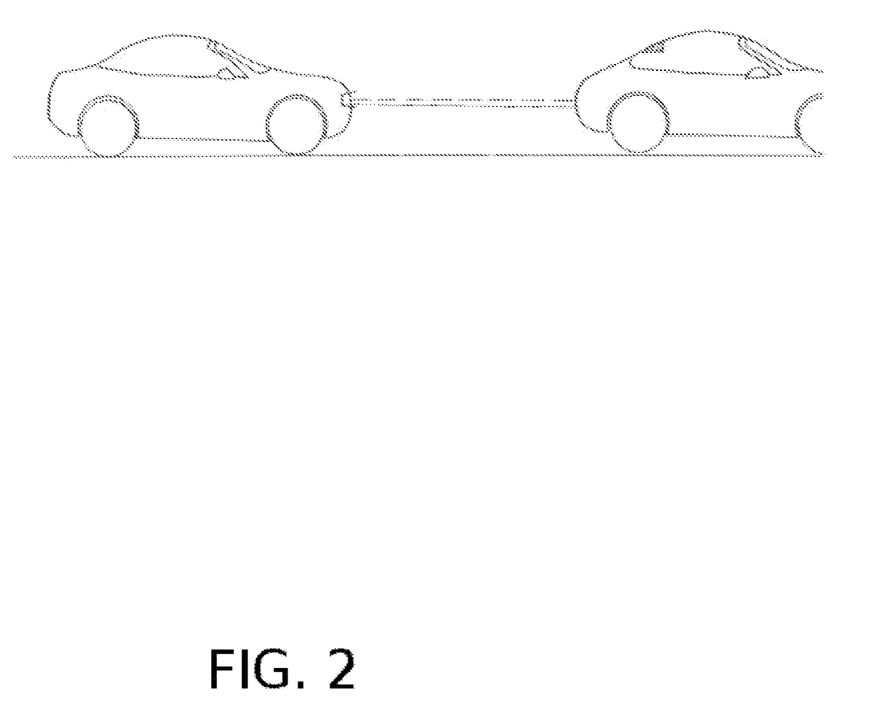
FIG. 2 is a lateral side view of the "ELECTROMAGNETIC BAND AND PHOTOELECTRIC CELL SAFETY DEVICE" of the present invention showing the application of the first set of sensors when in use: the dotted line representing the filtered electromagnetic radiation emitted by the photoelectric cell, and the solid line representing the electromagnetic radiation reflected by the other vehicle.
Figure 3:
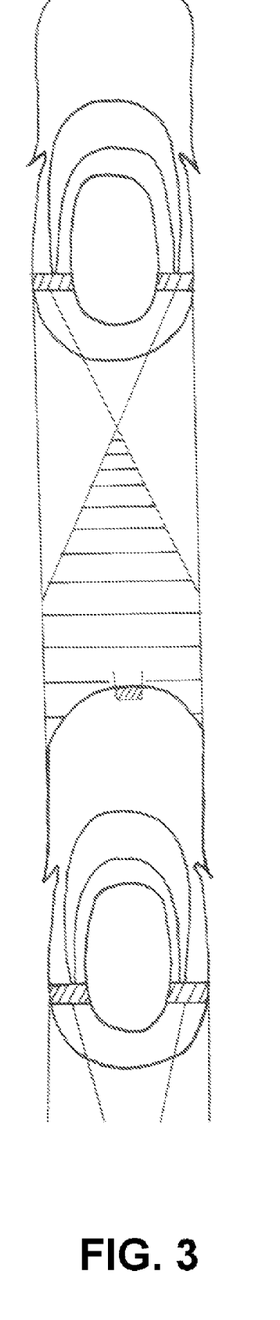
FIG. 3 is a top view of the "ELECTROMAGNETIC BAND AND PHOTOELECTRIC CELL SAFETY DEVICE" of the present invention when in use.

As it can be seen from the drawing the device of the present invention is a photoelectric cell device, to be used for safety on moving vehicles. With particular reference to FIG. 1 it is possible to see that the basic components of the disclosed device comprise two sets of photoelectric cells: a first set referenced with the roman numeral number one (1) installed on the front of the vehicle and a second set (3) generally installed on the back of the vehicle. Two sets connecting cables (4) and (7) connects respectively said first and second set of photoelectric cells to a Central Processing Unit (CPU) (8).

A first electrical circuitry (5) connects said Central Processing Unit (8) to the Gear Shifting Control Box of the vehicle (2). A second electrical circuitry (10) connecting said Central Processing Unit to the MAGNETIC BAND of the vehicle (11) and (12) respectively representing the front set of MAGNETIC BAND and the back set of MAGNETIC BAND. Two sets of MAGNETIC BAND activators not shown in the drawings. An MAGNETIC BAND actuator (9) is functionally connected in between said CPU and the sets of MAGNETIC BAND of the car. The a computer software program runs in the CPU handling the various input and output signals. A power source (14) is electrically connected to the CPU via electrical cable (15) and on of switch (13). From the CPU electricity is partitioned and distributed to all other elements of the device including the sets of photoelectric cells (1) and (2), the attenuator (9) and the MAGNETIC BAND activators via electrical connections.

In one of the preferred embodiments of the present invention said first set of photoelectric cells consists of retroflecting sensors. Retroreflective sensors houses both the emitter and receiver in one physical body. The light source is sent out and when it hits a reflector such as a car coming too close is returned from the reflector to the receiver in the same housing.

The back reflected light is filtered out and transmitted to a CPU (8) via a first set of connecting cables. In one preferred embodiment of the present invention both the first and the second set of cables are optic fibers. For the purpose of the present application an optic fiber, fiber optic, or optical fiber is defined as a thin, flexible, transparent fiber that acts as a waveguide, to transmit light between the two ends of the fiber. Optical fibers permit transmission over longer distances and at higher data rates than other forms of communication. Fibers are used instead of metal wires because signals travel along them with less losses are also immune to interferences. Once reaches the CPU the signal is transformed into an electrical signal.

In a separate embodiment the back reflected EM radiation is transformed into an electrical signal directly into said first of photoelectric cells and transmitted as such to the CPU (8) via a regular electrical circuitry. The advantage of using a fiber optic connection is that the time to transfer the light via the fiber optic and then process it close to the CPU (8) is much shorter than the time an electrical signal takes to complete the same route thus allowing for faster reaction times.

The electrical signal once reaches the CPU (8) is collected and analyzed triggering a output signal from the CPU (8) itself to the magnetic band systems of the vehicle. The output signal is mediated by an attenuator that for high intensity signals let a proportional activating action to the magnetic bands. Inversely for low intensity signals let a lower activating action on the magnetic bands. In other words when the other approaching vehicle is closer the amount of reflected light is higher thus causing a stronger electrical signal to be generated corresponding to a stronger breaking action. When the approaching vehicle is further away less light gets reflected into the EM radiation sensor generating a lower electrical signal corresponding to a weaker breaking action.

In one of the preferred embodiments of the present invention said second set of photoelectric cells (3) is mounted on the back of the vehicle and it is also consisting of retroflecting sensors. Said second set of photoelectric cells (3) is not active during regular operations of the motor vehicle but it gets activated when the vehicle's operator shift the gear in reverse. The Gear Shifting Control Box of the vehicle is not claimed or disclosed in the present application, but it is mentioned because when the vehicle operator shift the gear into reverse a signal is transmitted to the CPU (8) via said first electrical circuitry that trigger the activation of the second set of photoelectric cells (3).

In a separate alternative embodiment of the device of the present invention said second set of photoelectric cells (3) is of the diffused kind. For the purpose of the present application diffused photoelectric cells, also known as proximity sensors, or photsensors gets activated when they detect a pre set kind of light. Proximity sensors include both a source of radiation and a radiation receiver This light can be the light emitted by a source installed within the photosensor, in which case are reflective diffuse photoelectric cells or light or radiation emitted by a third body such as the human body. Normal human body temperature is 98.6 degrees. Most of our body heat is typically radiated away as far infrared at the 8~10 micron wavelength. So in one of the preferred embodiment of the present application an optical filter is installed to filter out lights other than the one coming within the wavelength interval comprised in between 7 and 11 micron in wavelength leaving that light activating the breaking mechanism via a system similar to the one described above.

For the purpose of the present application a LED is a light emitting diode based on a semiconductor light source. LEDs are used as indicator lamps in many devices, and are increasingly used as a source of light. The luminosity of LEDs is based on an effect called electroluminescence. The advantage of using a LED is that often it occupies only a small area, and integrated optical components may be used to shape its radiation pattern. A magnetic band activator is any mechanism that can trigger the braking action once receiving the proper electrical signal.

Figure 7:
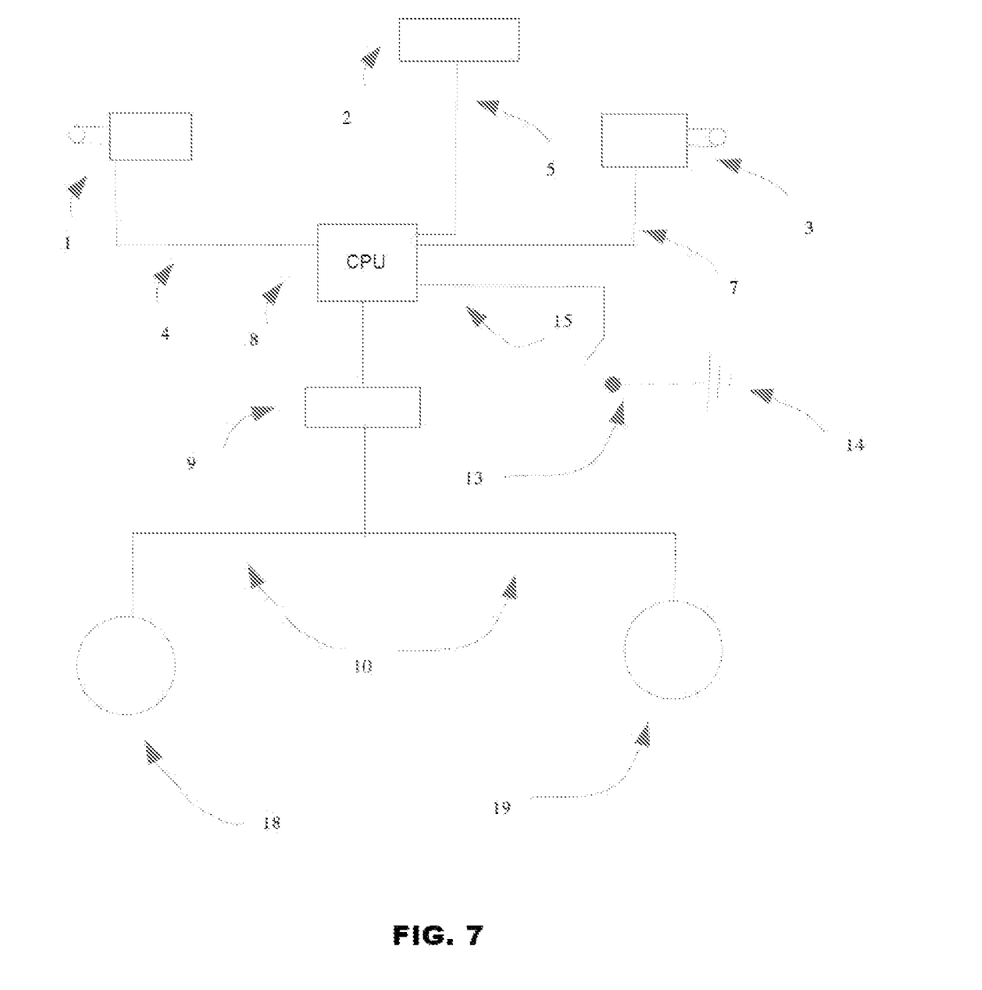
FIG. 7 is a diagram illustrating the general assembly of the ELECTROMAGNETIC BAND AND PHOTOELECTRIC CELL SAFETY DEVICE in accordance with the teachings of the present invention. This has the advantage over the prior art of activating the magnetic band (see FIG. 1), and the brakes of the vehicle (18-19) only upon some triggering event detected by the electronic eye.

In a separate embodiment of the present invention the device consists in a set of photoelectric cells installed at front and rear of trucks and automobiles for to avoid accidents when a distracted driver or a pedestrian, bike or animal crossing in front of the car could cause it. This kind of device commonly called "electric eye has an instantaneous reaction to any object being all of a sudden in front of it at a distance previously determined and set as we see in automatic doors of all types as well in all type of automatic machines. In vehicles it will activate the magnetic bands even before the driver reacts. The rear set of cells would be active only when the vehicle is moving backwards for the purpose of parking or leaving the parking place. In a separate preferred embodiment of the present invention the Photoelectric cells further controls the regular breaking system of the vehicle (18-19).

In one of the preferred embodiment of the present invention said sets of connecting cables (4) and (7), said first and second electrical circuitry (5) and (10), are replaced by wireless connections. Wireless connections are ensured by Radiofrequency (Rf) apparatuses that include both a receiver and a transmitter, installed respectively close by the CPU (8), the set of magnetic bands (11-12), and the photoelectric devices (1 and 3).

A development is the use of Photoelectric cells (1 and 3) within the bumpers of the automobiles. Photoelectric cells are electronic devices producing current proportional to the intensity of the illumination applied. Photocells are used in control systems, where interrupting a beam of light opens a circuit, actuating a relay that supplies power to a mechanism to bring about a desired operation, which in this case, would be the activation of the magnetic bands (11-12). Most accidents occur at lows speeds when the driver is not paying attention to what is in front of him/her, usually attributed to texting, applying make-up, or searching the radio. Having the integration of the photoelectric cells (1 and 3) in the bumper and the electric system would provide a safety feature that would activate the magnetic bands, even if the driver is unaware.

Figure 4:
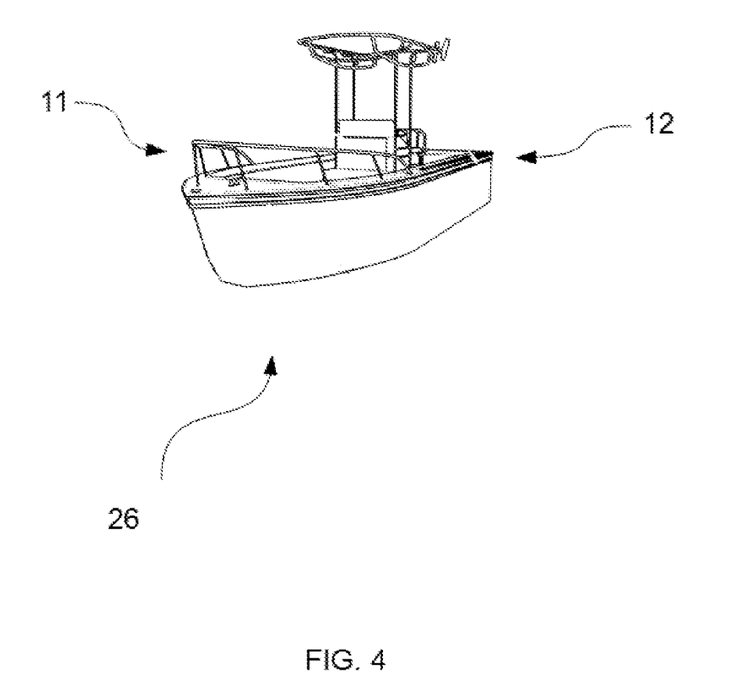
FIG. 4 is a perspective view of one of the preferred embodiments of the Electromagnetic band (11 & 12) of the present invention installed respectively on the front (11) and on the back (12) of a boat in accordance with the teachings of the present application.
Figure 5:
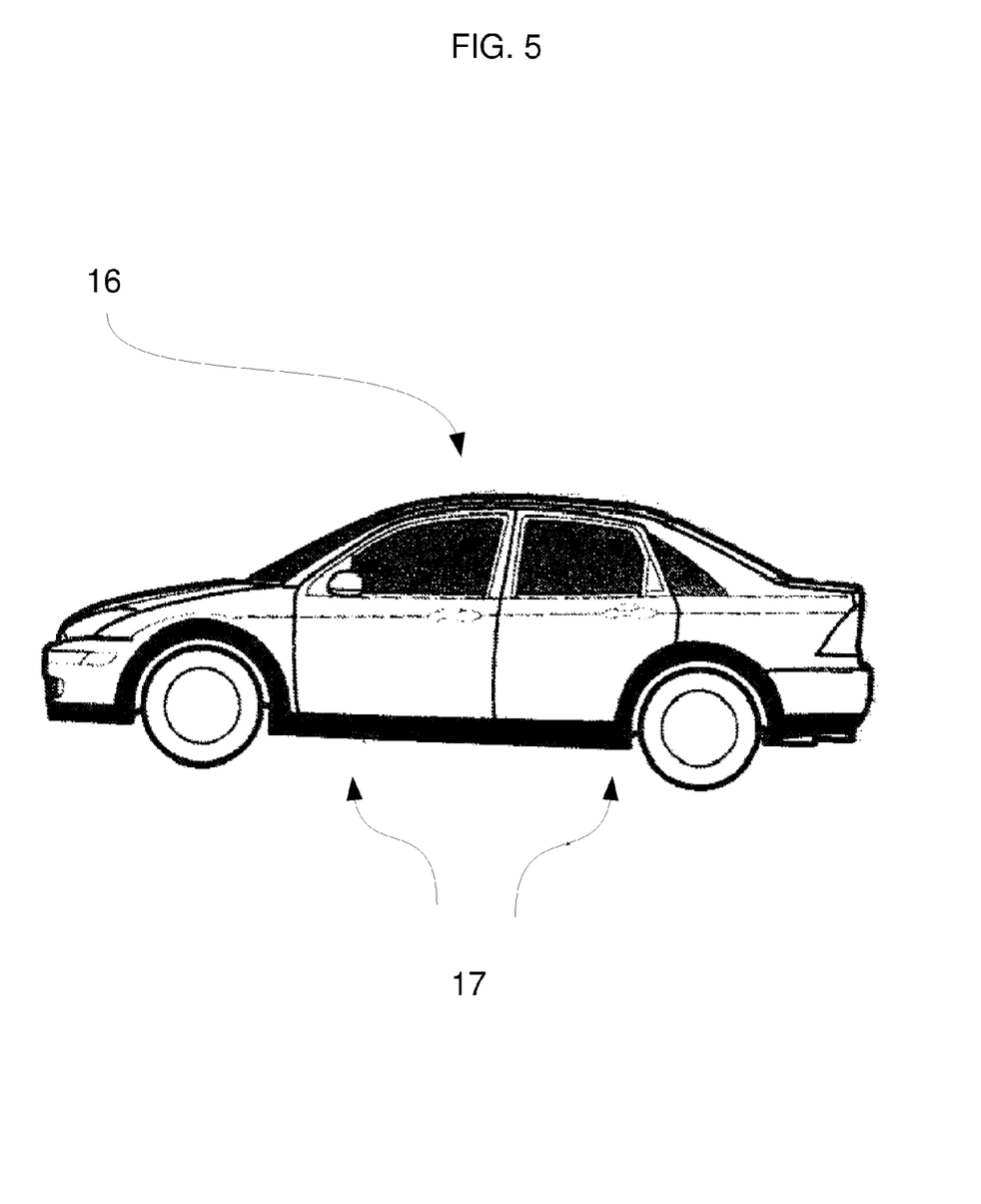
FIG. 5 is a side elevation view of a car (16) equipped with the "ELECTROMAGNETIC BAND AND PHOTOELECTRIC CELL SAFETY DEVICE" of the present application showing a wraparound design (17) for the magnetic band portion of the device.
Figure 6:
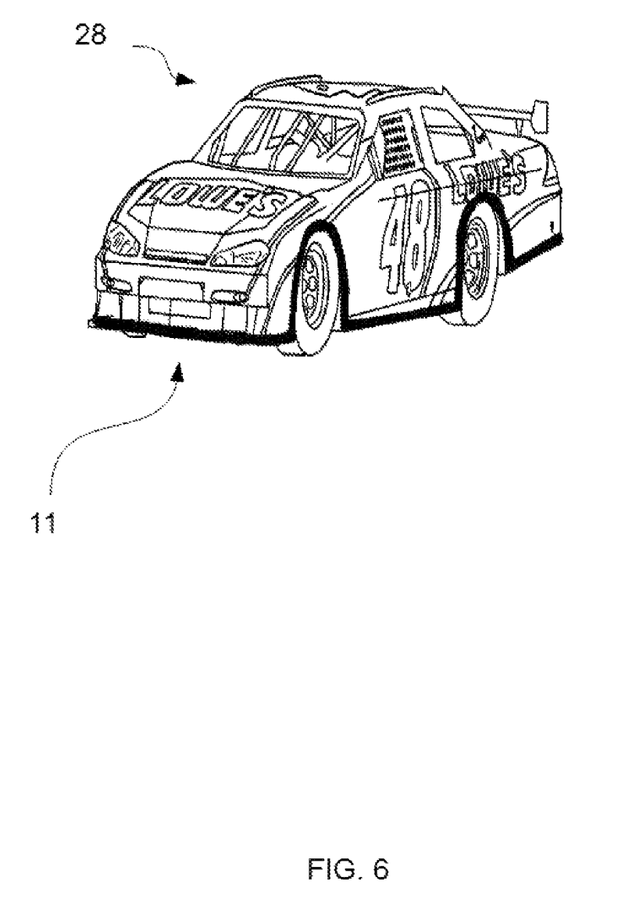
FIG. 6 is a front perspective view of a car equipped with the "ELECTROMAGNETIC BAND AND PHOTOELECTRIC CELL SAFETY DEVICE" of the present application showing the front electromagnetic band (11) portion of the device.

As it can be seen from the drawings the preferred braking system of the present invention consists in an electromagnetic band that in some embodiments such as the ones illustrated in FIGS. 4-6 wraps around various automobiles such as cars, boats, and trains, and in other embodiments is used as a bumper only. The drawings show that the main components of the device are: a boat (26), a magnetic band (11-12), and an adhesive back side (20). In various embodiments of the present invention the boat (26) can be substituted respectively by a train (27), or train wagons, and cars (5), such as race cars (28).

For the MAGNETIC BAND of the present invention to be effective both approaching vehicles must be equipped with the special magnetic band (11-12) of the present invention. The band is designed to apply always a positive (either North or South) magnetic field toward the outside of the vehicle and a negative field toward the inside. In this way each vehicle would have the same polarity and the force resulting by the interaction with another vehicle is of the repulsive kind.

According to classic magnetic theory the repulsive force between two identical cylindrical bar magnets is given by equation (1):

$$F = \left[\frac{B_0^2 A^2 (L^2 + R^2)}{\pi \mu_0 L^2}\right]\left[\frac{1}{x^2} + \frac{1}{(x+2L)^2} - \frac{2}{(x+L)^2}\right]$$

where $B_0$ is the magnetic flux density very close to each pole, in T; A is the area of each pole, in m$^2$, L is the length of each magnet, in m, R is the radius of each magnet, in m, and x is the distance that separates the two magnets. Being the bands installed on the outside surface of the vehicles under the teachings of the present invention, then x also represents the distance in meters between the two vehicles.

Magnetic flux can be either generated by a natural magnet or by an electromagnet. In one preferred embodiment of the present invention an electromagnet is used to generate the magnetic flux, while in a different preferred embodiment of the present invention a natural magnet is used.

Natural Magnets include magnetic rocks, but also human made alloys such as Yttrium Cobalt (YCo$_5$) Alloy, or magnetized materials such as Iron, or Rare Earth Metals, Neodymium, Neodymium alloys such as Nd$_2$Fe$_{14}$B and so on. Due to the potential for_oxidation of metals in one preferred embodiment of the present invention said magnet is sealed with an air tight material. Air tight sealing can be achieved wither by wrapping in a solid shell of plastic or plating it with a Noble metal such as copper or gold.

Magnetic field comes always in opposite poles. So either a natural magnet or an electromagnet generate a magnetic flux going from one to the other pole. In this way though the internal side of the magnet, the one directed toward the vehicle would generate a magnetic flux of the opposite direction, but of the same intensity of the one generated by the side of the magnet looking outward with respect to the vehicle. This flux, if left uncontrolled could potentially attract other vehicles. This the need to control this flux.

U.S. Pat. No. 8,403,402 issued on Mar. 26, 2013 to Mario Placido Portela discloses two way of controlling the magnetic flux generated by the side of the magnet directed to the vehicle: a first way and a second way. In said first way the band is designed to be physically surrounding the vehicle, as shown in FIGS. 4-6, so that the repulsive force, because the distance between the two repelling magnets is shorter than the distance between the repelling and the attractive magnet, is always higher in magnitude than the attractive force.

Figure 8:
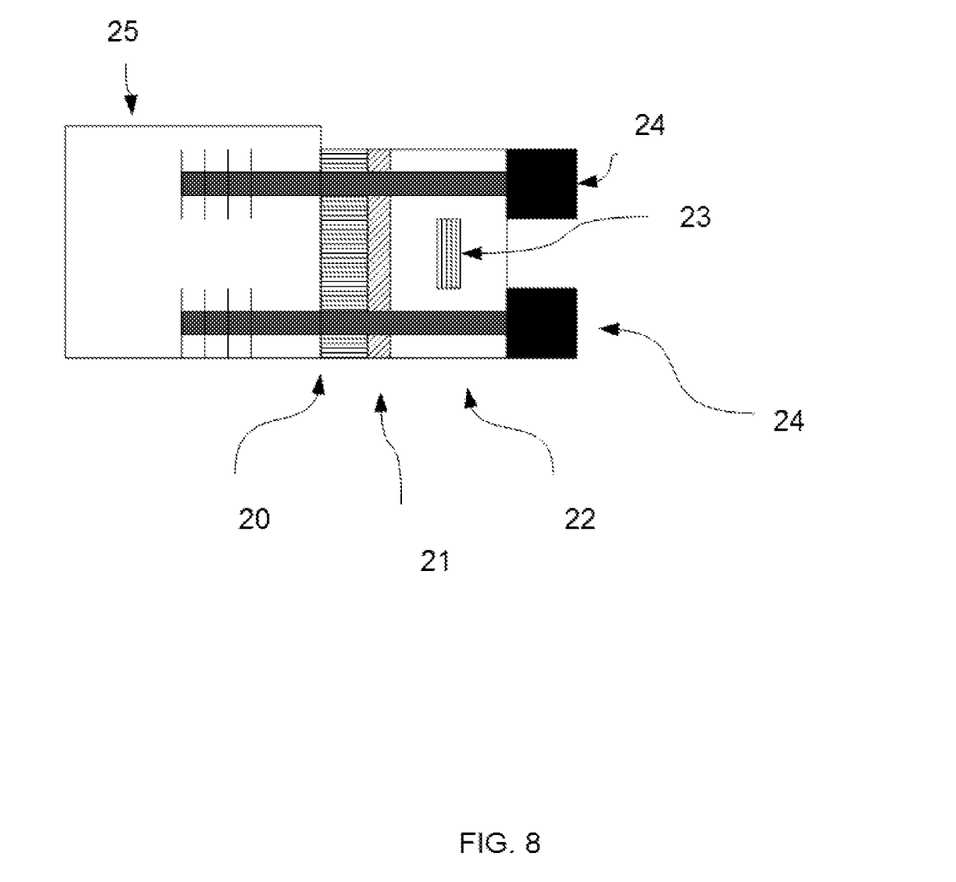
FIG. 8 is a cross sectional detail view of the Electromagnetic band of the present invention.

The second way is to use a magnetic flux shielding material (21) in between the vehicle and the inside of the magnet, as shown in FIG. 8, so that that side of the flux of the opposite sign of the repulsive one is shielded and decreased in intensity. Example of magnetic flux shielding materials include Nickel alloys, Lead films, or a mixed meshes of silver and nylon.

In the specific the present application discloses ad efficient and effective the use of a particular Nickel alloy composed by 80% Nickel, 4.5% Molybdenum, and balance Iron to be used as magnetic shield for said internal surface of the magnet.

In the case in which the magnet (23) is an electromagnet a source of electrical power (not shown in the drawings) is electrically connected via an electrical circuitry (not shown in the drawings) to the coils of said electromagnet. Said source of electrical power may either be the car battery or a separate supplemental battery.

In U.S. Pat. No. 8,403,402 issued on Mar. 26, 2013 to Mario Placido Portela there is no magnet insulation but there are simple magnetic shields (21) to protect any vehicle instrument and as it can be seen in the drawings the rings at the lowest possible place. For regular transportation vehicles (5, 26, 27, and 28), for this system to be applied, it would need mandatory regulations as we have on the seat belts to set this protection on all cars and also the bands would be only applied at front and rear bands, because of the different designs.

As it can be seen in the car (5) drawing the ring is attached all around the race car (28) and the magnetic force is manually set on for the complete race, setting it off only for maintenance. About boats (26) the magnetic force would only be set manually when a possible accident is imminent. Also the front and rear ends will need a vertical design of the magnetic band because of the up and down motion of the sea level, but on both sides it is set just above the floating line of the boat (26), which will make all boats and or docks bands (11-12) to face each other.

Figure 9:
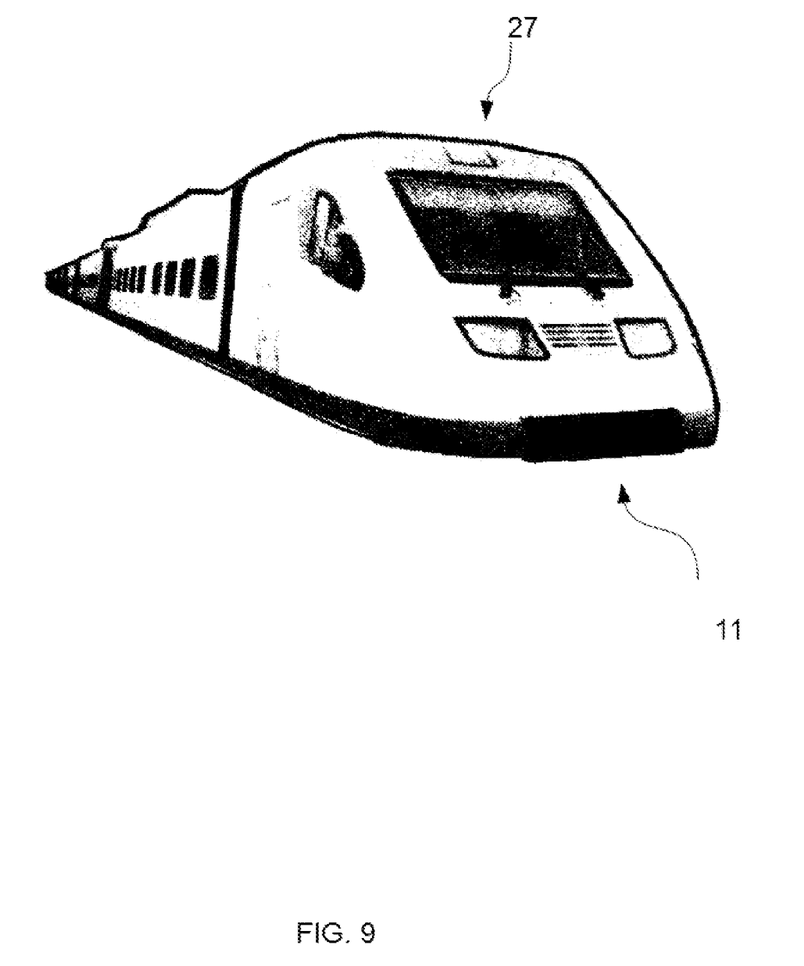
FIG. 9 is a perspective view of one of the preferred embodiments of the Electromagnetic band (11) of the present application installed on front of a train (27) and in between the wagons.

Referring to regular railroad trains (27), there is a main possible advantage when using magnetic bands (11) in between the the front machine and the first wagon because of the possibility of separate them in an emergency, if so only the machine would face the situation, so it could be easier for the operator to stop it. City trains, Metromovers, and the like work without operator, so the system would be implemented automatically by means of photoelectric cells as well as in already existing city trains.

The main advantage of combining the magnetic band of commonly authored and owned U.S. Pat. No. 8,403,402 with an electronic eye is that the activation of a magnetic bumper, either in its single (11 and 12) or wraparound (17) design, rather than the regular brakes (18-19) does not affect the driving. That is the driver can keep driving calmly and safely and if some one else comes about the impact is avoided by the intangible shield effected by the magnetic bumper.

Other systems that activates brakes (18-19) are dangerous as they interfere with the normal driving, thus creating potential for loss of control of the vehicle. The magnetic band used in the present present invention consists in an electromagnetic band (11-12) device that in some embodiments such as the ones illustrated in FIG. 5 wraps around (17) various automobiles such as cars (5), boats (26), and trains (27), and in other embodiments such as the ones illustrated in FIG. 4 is used as a bumper only. The main components of the magnetic band are: a vehicle (5, 26, 27, and 28) such a boat (26), a magnetic band (11-12 or 17), and an adhesive back side (20). In various embodiments of the present invention the boat (26) can be substituted respectively by a train (27), or train wagons, and cars (5), such as race cars (28).

The structure of the magnetic band of the present invention comprising an adhesive layer (20), a magnetic shield (21), a support member (22), and a magnet (23). In a separate embodiment of the present invention the fastening action of said adhesive layer (20) is supported by fastening means (24) such as screw, nails, bolts, washers, or the like annexed to the body of the vehicle (25). Due to the electromagnetic nature of the present invention said fastening means may be made of magnetically insulating material such as plastic, polymeric resins, fiberglass, or the like. Additionally the present invention teaches that the magnetic band is may be activated manually.

In the case in which the magnet (23) is an electromagnet a source of electrical power (not shown in the drawings) is electrically connected via an electrical circuitry (not shown in the drawings) to the coils of said electromagnet. Said source of electrical power may either be the car battery or a separate supplemental battery.

The advantage of combining a photoelectric cell (1 and 3) with a magnetic band (11-12 and 17) acting as bumper is that during normal operations of the vehicle the magnetic band (11-12 and 17) is deactivated: thus not interfering at all with the operations of the driver. Then when an event triggers the magnetic bumper (11-12 and 17) to go on, still because of the non-contact nature of the magnetic field any consequences on the vehicle and its driver are minimal, as the magnetic field force would repel the equally oriented incoming vehicle without (or before) getting into a crash.

This invention requires that both vehicles should be equipped with the same kind of combination of magnetic band (11-12 and 17) plus photoelectric cell (1 and 3) or at least with the same kind of magnetic band to work. As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A safety device, combining a photoelectric cell together with a magnetic band, installed on a vehicle, said safety device comprising:
   A) two sets of photoelectric cells: a first set installed on the front of the vehicle and a second set installed on the back of the vehicle;
   B) two sets connecting fiber optic cables respectively connecting said first set and second set of photoelectric cells to a Central Processing Unit;
   C) a first electrical circuitry connecting said Central Processing Unit to the Gear Shifting Control Box of the vehicle;

D) a second electrical circuitry connecting said Central Processing Unit to the brakes of the vehicle;
E) a magnetic band comprising:
    a support member having a magnet disposed therein,
    an adhesive layer mounting said support member to the vehicle, and
    a magnetic flux shielding material disposed between the vehicle and said magnet such that a magnetic flux of said magnet in the direction of the vehicle is shielded and decreased in intensity by said magnetic flux shielding material;
F) a computer software program;
G) two sets of magnetic band activators;
H) a power source;
I) an on off switch;
J) an electrical connection between the power source and said Central Processing Unit.

2. The safety device, combining a photoelectric cell together with a magnetic band, of claim 1 further characterized in that said second set of photoelectric cells are generally installed on the superior portion of the vehicle.

3. The safety device, combining a photoelectric cell together with a magnetic band, of claim 1 further characterized in that said second set of photoelectric cells are generally installed on the lower portion of the vehicle.

4. The safety device, combining a photoelectric cell together with a magnetic band, of claim 1 further characterized in that said first set of photoelectric cells consists of retroflecting sensors that includes an LED source of radiation.

5. The safety device, combining a photoelectric cell together with a magnetic band, of claim 1 further characterized in that said second set of photoelectric cells are proximity sensors that include a radiation receiver and an EM filter that shields all EM radiation with the exception of EM radiation having a wavelength between approximately 7 and 11 microns.

6. The safety device, combining a photoelectric cell together with a magnetic band, of claim 1 further characterized in that said power source is a solar panel.

7. The safety device, combining a photoelectric cell together with a magnetic band, of claim 1 further characterized in that said photoelectric cell also activates the brakes of the vehicle.

8. A safety device, combining a photoelectric cell together with a magnetic band, installed on a vehicle, said safety device comprising:
A) two sets of photoelectric cells: a first set and a second set composed each by two photoelectric cell;
B) five RF apparatuses each of which installed in correspondence of each photoelectric cell and one in correspondence of a CPU;
C) said CPU wirelessly connected to said photoelectric cells;
D) a computer software program running on said CPU;
E) two sets of magnetic band activators wirelessly connected to said CPU;
F) a power source;
G) an on off switch;
H) a magnetic band comprising:
    a support member having a magnet disposed therein,
    an adhesive layer mounting said support member to the vehicle, and
    a magnetic flux shielding material disposed between the vehicle and said magnet such that a magnetic flux of said magnet in the direction of the vehicle is shielded and decreased in intensity by said magnetic flux shielding material; and
J) an electrical connection between the power source and said CPU.

9. The safety device, combining a photoelectric cell together with a magnetic band, of claim 8 further characterized in that said RF apparatuses include both a source and a receiver of RF waves.

10. The safety device, combining a photoelectric cell together with a magnetic band, of claim 8 further characterized in that said first set of photoelectric cells consists of retroflecting sensors.

11. The safety device, combining a photoelectric cell together with a magnetic band, of claim 8 further characterized in that said second set of photoelectric cells are proximity sensors.

12. The safety device, combining a photoelectric cell together with a magnetic band, of claim 8 further characterized in that said proximity sensors are equipped with an EM filter having a cutoff for EM radiation having a wavelength between approximately 7 and 11 microns.

13. The safety device, combining a photoelectric cell together with a magnetic band, of claim 8 further characterized in that said second set of photoelectric cells are retroflecting sensors.

14. The safety device, combining a photoelectric cell together with a magnetic band, of claim 8 further characterized in that said photoelectric cell also activates the brakes of the vehicle.

* * * * *